United States Patent
Rath et al.

[19]

[11] Patent Number: 6,110,643
[45] Date of Patent: *Aug. 29, 2000

[54] METHOD OF FORMING A MULTILAYER PRINTED CIRCUIT BOARD AND PRODUCT THEREOF

[75] Inventors: James Rath, Orange; William Luong-Gia Tran, Garden Grove; Kathy M. Flynn, Santa Clarita; Vinai Ming Tara, Anaheim; Thomas A. Koes, Riverside; Vincent J. Nizzo, Tustin, all of Calif.

[73] Assignee: Morton International Inc, Chicago, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/969,519

[22] Filed: Nov. 13, 1997

Related U.S. Application Data

[63] Continuation of application No. 08/749,042, Nov. 14, 1996, abandoned, which is a continuation of application No. 08/662,816, Jun. 12, 1996, abandoned, which is a continuation of application No. 08/446,391, May 22, 1995, abandoned, which is a division of application No. 08/271,614, Jul. 7, 1994, abandoned, which is a continuation-in-part of application No. 07/883,436, May 15, 1992, abandoned.

[51] Int. Cl.[7] ............................. G03F 7/028; G03F 7/032
[52] U.S. Cl. ....................................... 430/280.1; 522/103
[58] Field of Search .......................... 430/280.1; 522/103

[56] References Cited

U.S. PATENT DOCUMENTS 5,229,252   7/1993   Flynn et al. ..................... 430/280.1

FOREIGN PATENT DOCUMENTS 62-265321   6/1987   Japan .
1-197520    8/1989   Japan ................................. 430/280.1

*Primary Examiner*—Cynthia Hamilton

[57] ABSTRACT

In a process for fabricating a multilayer printed circuit board with permanent innerlayers of photoresist, the photoimageable composition used to form the hard permanent layer comprises a polymerizable acrylate monomer; an oligomer formed by the reaction of an epoxy resin and an acrylic or methacrylic acid; a photosensitive, free radical generating initiator for polymerization of the acrylic monomer and oligomer; a curable epoxy resin; a curing agent for the epoxy resin; and, optionally, a crosslinking agent reactive with hydroxyl groups. After exposure and development of a layer of the photoimageable composition and etching of the underlying metal layer on a board, the resultant photoresist is left on the circuitry traces. The innerlayers of photoresist are stacked in a press where it initially conforms under heat and pressure to fill voids between the innerlayers and then cures to permanence.

4 Claims, 2 Drawing Sheets

METHOD OF FORMING A MULTILAYER PRINTED CIRCUIT BOARD AND PRODUCT THEREOF

This is a continuation of application Ser. No. 08/749,042 filed on Nov. 14, 1996, now abandoned; which is a continuation of 08/662,816 filed Jun. 12, 1996, now abandoned; which is a continuation of 08/446,391 filed May 22, 1995 now abandoned; which is a division of 08/271,614 filed Jul. 07, 1994, now abandoned; which is a C-I-P of 07/883,436 filed May 15, 1992, now abandoned.

The present invention is directed to a method for forming a multilayer printed circuit board, and more particularly to a method of forming a multilayer printed circuit board in which a photoimageable composition used to print the individual innerlayers forms substantially all of the dielectric material separating the innerlayers from each other.

BACKGROUND OF THE INVENTION

Multilayer printed circuit boards comprise a stack of individual printed circuit boards or innerlayers separated by dielectrical material. The circuitry of the several innerlayers is electrically connected by bored and plated-through holes. Multilayer printed circuit boards provide circuitry in a three-dimensional array and are therefore advantageously space-saving, relative to individual printed circuit boards, which provide at most two layers of circuitry on a two-sided board.

These printed circuit boards are commonly provided with internal ground and power planes. These internal planes are frequently solid sheets of copper interrupted only by clearance holes (the perforations required for electrically isolating the through hole pattern of the printed circuit board). Ground and power planes provide power voltage and current and ground connections for the components of the multilayer printed circuit. A second function of the ground and power planes is to provide electromagnetic shielding for the multilayer printed circuit board and reduce the electromagnetic and radio frequency interference. Multiple ground and power planes and additional ground planes on the surface layers with the conductive pattern are common.

When components are mounted on a multilayer printed circuit board and mass soldered in place at temperatures on the order of about 275° C. (527° F.), a severe thermal shock is applied to the insulating layers placed between two copper planes, such as the insulating layer between an internal ground plate and ground shield on the surface surrounding the conductor pattern. Frequently, delamination will occur and blisters will form between the ground shield on the surface and the internal ground or power plane. Delamination and blistering have been a problem with multilayers made by a fully additive, semi-additive, or subtractive sequential processes.

In a conventional subtractive procedure for forming multilayer printed circuit boards, the innerlayers are formed in the manner of individual two-sided printed circuit boards. A blank board formed of epoxy that is covered on each side with a metal layer, such as copper, is coated on each side with a layer of primary photoresist. The primary photoresist may be coated as a liquid resist or applied as a dry film. The layers of photoresist are exposed to patterned actinic radiation by placing artwork over the photoresist layers and directing light through the artwork to the photoresist layers. Subsequently, the exposed photoresist layers are developed in an appropriate aqueous medium to remove exposed or unexposed portions of the photoresist layers, depending upon whether the photoresist is positive-acting or negative-acting. The metal layer is then etched away in the areas from which the overlying photoresist has been removed. After etching, the remaining portions of the photoresist layers are stripped from the surfaces of the board. In the conventional procedure, the copper surfaces which have been uncovered by the stripping process are then treated to enhance adhesion of the copper to the pre-preg in subsequent steps.

The individual innerlayers are stacked with alternating layers of "prepreg" material, which typically comprises an epoxy/fiberglass composition. The assembly of innerlayers and prepregs is then pressed together and heated. The prepreg material initially flows under the heat and pressure, filling the voids between the innerlayers, and eventually cures under these conditions to form a hard permanent dielectric material separating the individual circuitry layers.

It has been the practice to apply an initial, strongly adherent oxide layer to the copper to enhance the bond between the copper conductive patterns and the insulating layers. The oxide layers are usually applied by immersing the copper surface in hot (40°–110° C.), strongly alkaline, hypochlorite solutions. This immersion produces a black, dendritic oxide layer with a high surface area for adhering to organic films, coatings, and laminated layers. In the printed circuit industry, this oxide is commonly called "black oxide".

To electrically connect the circuitry of the several innerlayers, holes are drilled through the cured assembly. The heat so generated causes an epoxy resin "drill smear" on the inner layer copper surface around the drilled hole prior to the electroless plating of the hole wall. The hole walls are plated to create electrical connections to the inner copper planes. The desmearing and plating solutions dissolve the black oxide surrounding the holes and leave non-adherent rings around the holes. This is known as "pink ring" because of the ring of copper visible in the pattern of black oxide. At the pink ring, the adhesion between the copper plane and the laminated insulating layer over it is reduced. Ionic contamination and the failure of insulation between holes occur where pink ring is found.

As can be seen, the above process requires a number of steps, and it is a primary object of the present invention to produce multilayer printed circuit boards utilizing fewer production steps.

It is a related object of the invention to eliminate the need for an oxide treatment of the copper layers to improve their adhesion to the epoxy/fiberglass substrate.

It is a further related object of this invention to eliminate pink ring on the innerlayers of a multilayer printed circuit board.

It is yet another related object of this invention to eliminate wedge voids caused by the action of desmearing chemicals at the black oxide/epoxy interface on the innerlayers.

It is another object of this invention to provide a multilayered printed circuit board in which the prepreg dielectric material is substantially replaced by a permanent innerlayer of photoresist material.

It is another object of this invention to provide permanent innerlayer resists which are very thin and can be imaged on contact.

It is a related object to provide permanent innerlayer resists having enhanced printing resolution capabilities.

It is a further related object to provide multilayer printed circuit boards having improved resolution of the circuitry images thereon.

Other objects of the invention include reducing the materials used in the process of producing multilayer circuit boards and limiting the negative impact on the environment associated with prior compositions and methods for making such boards.

SUMMARY OF THE INVENTION

In accordance with the present invention, the boards to be used as innerlayers of a multilayer printed circuit board are formed using a resist that is not only photoimageable but is hardenable to form a permanent dielectric material. The individual innerlayers are printed in a usual manner. A board of dielectic base material, such as a glass fiber reinforced epoxy resin, having a layer of copper on each side thereof is covered on both sides with a hardenable photoimageable resist. The resist may be applied by a variety of methods such as screen printing, electrostatic spray coating, spin coating, curtain coating, single- or double-sided roller coating, dip coating, extrusion coating, or as a layer or laminate of dry film. The resist is then exposed to patterned actinic radiation and developed in an appropriate developer to remove either the exposed or non-exposed portions of the photoresist. Next, the processed board is subjected to an alkaline etchy or an etch with an acidic solution of cupric/cuprous chloride that removes the metal layers from those regions where the resist has been removed. The resist, rather than being stripped after exposure, development and etching, is left on the innerlayers as a supplement for or replacement of the prepregs normally used to form dielectric layers between the innerlayers. In the manner of prepregs, the photoimageable composition layer, under heat and pressure, initially conforms to the contours of the innerlayers, filling in the voids between the innerlayers, and subsequently cures to form at least a portion of permanent dielectric layers separating the circuitry of the individual innerlayers. The multilayer board is completed in a normal manner by boring holes through the cured assembly, removing the "drill smear" from the copper layers, and lining the bored holes with metal by an electroless plating procedure.

The present invention provides an improved process for fabricating a multilayer printed circuit board, rigid or flexible, which comprises:

(A) providing a plurality of innerlayer boards, each comprising a dielectric base and a metal layer thereon;

(B) coating each of the metal layers with a layer of a photoimageable composition comprising:
 (a) from about 5 to about 40% by weight of a polymerizable acrylate monomer;
 (b) from about 5% to about 35% by weight of an oligomer formed by the reaction of an epoxy resin and an acrylic or methacrylic acid;;
 (c) a photosensitive, free radical generating initiator for polymerization of the acrylate monomer and the oligomer;
 (d) a curable epoxy resin;
 (e) a curing agent for the epoxy resin; and
 (f) from 0% to about 15% by weight of a cross-linking agent reactive with hydroxyl groups, all based on the total weight of components (a) through (f);

(C) exposing each of said layers of photoimageable composition to a pattern of actinic radiation to polymerize the acrylic monomer and oligomer;

(D) creating photoimaged layers of the composition on the boards by dissolving the unexposed portions of each layer in an aqueous alkaline medium to uncover metal according to the pattern;

(E) etching the uncovered metal to remove it;

(F) stacking the boards having the photoimaged layers, with or without standard prepreg material, and applying heat and pressure to the stack to cure the composition in each layer and form hard, permanent innerlayers between the boards; and (G) connecting the circuitry of the stacked boards.

DETAILED DESCRIPTION OF CERTAIN PREFERRED EMBODIMENTS

Figure 1:
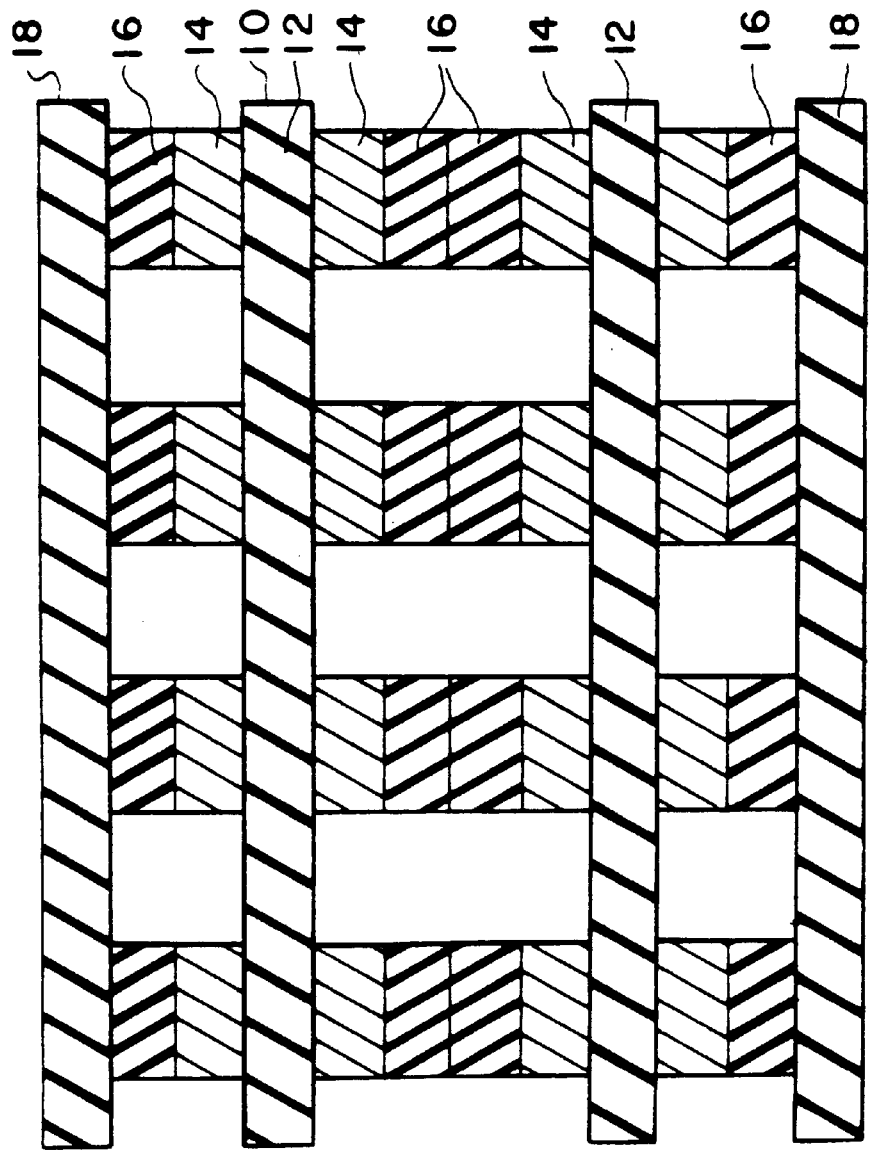
FIG. 1 is an elevation of an assembly of exposed, developed and etched innerlayers of this invention between two outerlayers as they are about to be pressed to form a multilayer printed circuit board in accordance with the present invention.

The particular monomer combinations, monomer/oligomer combinations, and their interaction with other components in the formulation will affect the degree of tackiness and other properties of the photoresist that are desired. Preferably, the photoimageable composition is prepared in two parts, the first part containing the oligomer and the second containing the epoxy resin, and then mixed shortly before application to the substrate. The temperature during preparation is chosen to facilitate high shear mixing of the components of the two parts; it may be conveniently at room temperature or high as about 200° F. at superatmospheric pressure.

As described above, the photoimageable composition is applied as a layer to the copper clad substrate (or to a support sheet to form a dry film which is then laid on the copper). The particular application method used will also depend to some degree on the particular formulation of the photoimageable composition used. In a preferred roller coating operation, there is no differential between the speed of the photoresist application rollers and the drying oven conveyor speed so that scoring at the edges of the board does not occur. The conveyor speed may be from about 5 to about 7 feet per minute. Suitably, the groove density of the rollers is 40 threads per inch, the groove depth is 0.010 inch, and the groove angle is 76°. After application, the wet layer is dried to remove organic solvent. During this drying, some reaction of components may occur. The thermally driven reaction serves to increase crosslink density and advance the overall molecular weight of the film. Condensation reactions may occur between an anhydride and a melamine-formaldehyde resin, or between an epoxy cresol novolac and a hydroxyl- and/or carboxylic acid functional oligomer.

If there is a significant hold time after drying before the desired exposure of the photoimageable layer, it may be covered by a sheet of black polyethylene or the like. It is then exposed to patterned actinic radiation at an energy level sufficient to cause enough crosslinking to prevent attack by the aqueous alkaline developer that follows in the conventional process. The intensity and time of the light exposure must also be correlated with the drying temperatures and the oven conveyor speed to achieve the optimal performance. It is preferred to effect a UV cure at an energy level of from about 150 to about 350 millijoules/cm$^2$ to tie up any unreacted acrylate prior to lamination and preferably after etching of the copper exposed by the developer. Additional UV flood irradiation upon development prior to etching of the exposed copper is not required.

The ability to be developed with aqueous or alkaline aqueous solutions and with or without organically based antifoam agents, is an important advantage of the photoimageable composition of the present invention. Eliminating the need for solvent-based developers eliminates the cost of the solvents as well as health, environmental and recycling problems. Although the films formed in accordance with the invention are developable in aqueous solutions without any organic solvents, developers may include some organic solvents, providing that the added organic solvent does not solubilize the exposed portions of the film.

In FIG. 1 of the drawings, each innerlayer 10 comprises a base layer 12 of dielectric material, circuitry traces 14 on the opposite faces thereof, and the photoimageable composition 16 overlying the circuitry traces 14. Although not shown here for the sake of clarity, the outerlayers 18 may have circuitry traces on their inner faces, only, before pressing of the assembly; the outer faces thereof would still retain a bare layer of copper foil which may be coated with resist, exposed, developed, and etched after the multilayered board comes out of the press.

In the prior art method of forming a multilayer circuit board, the photoimageable composition used instead of composition 16 would have been stripped from the circuitry traces 14 and the exposed circuitry traces would have been treated in a chemical bath. In the process of the present invention, the photoimageable composition 16 is not stripped. The need for a stripper is eliminated, as are any problems associated with disposal of the stripper. Elimination of the stripping stages of the conventional process permits increased throughput of a multilayer board and reduces the resources required for its production.

Figure 2:
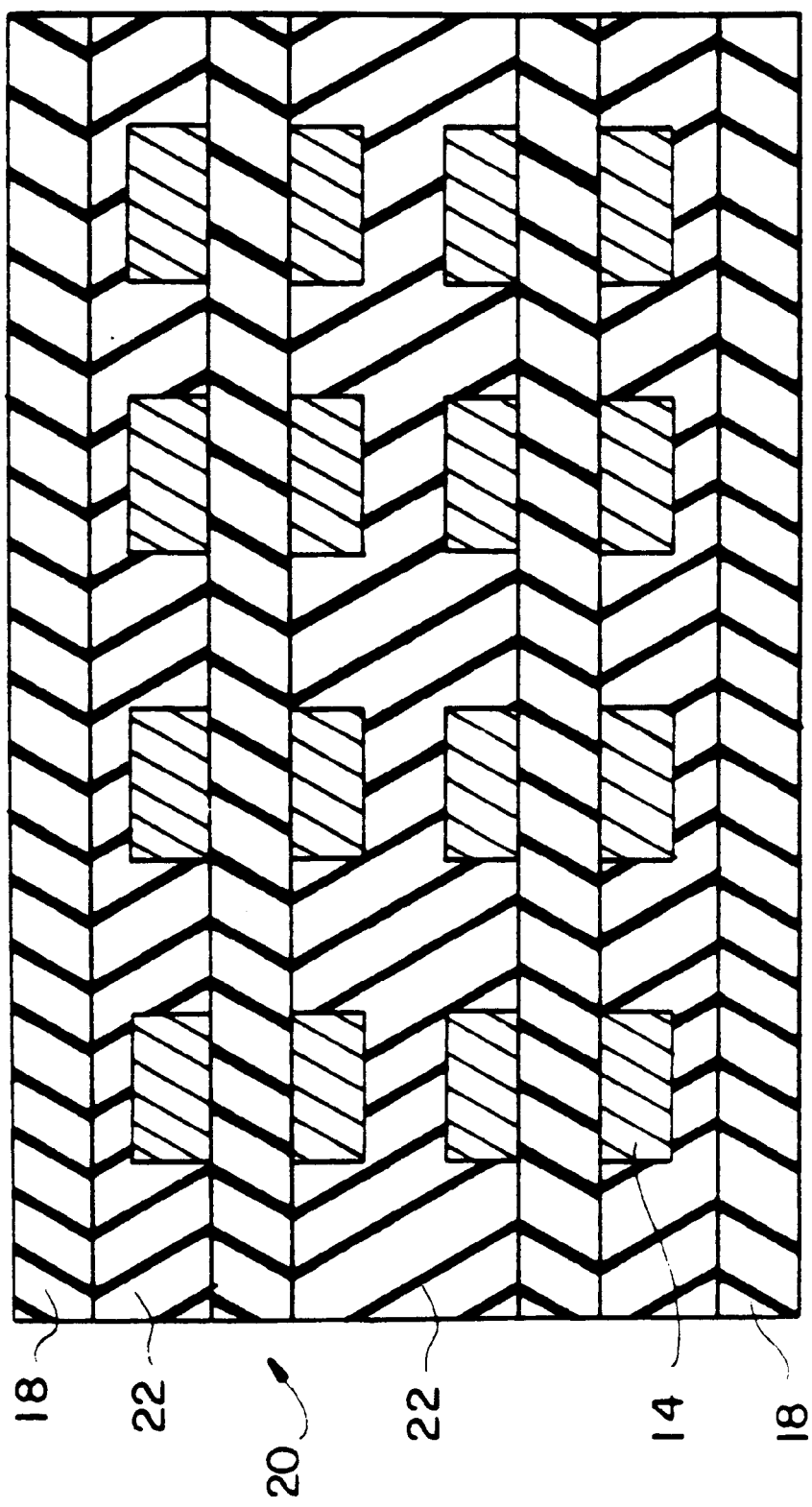
FIG. 2 is an elevation of a multilayer board made from the assembly of FIG. 1.

At this point, there are several options available in forming the multilayer circuit board. In the option shown in FIGS. 1 and 2, the innerlayers 10 and outerlayers 18 are merely stacked in a standard multilayer press and the assembly is subjected to heat and pressure which initially squeezes the still flowable photoimageable composition 16 into the voids between the innerlayers 10 to form the board 20 of FIG. 2. The board 20 is maintained under heat and pressure for from about 3 to about 3.6 hours, during which time the photoimageable composition 16 cures to form hardened, permanent dielectric layers 22 which electrically separate the circuitry traces 14 of the innerlayers 10.

The conditions of heat and pressure are somewhat dependent upon the particular photoimageable composition selected for the process. In a suitable procedure known as the hot start/dual pressure procedure or the "kiss" procedure, the assembly is held at about 350° F. (177° C.) at about 50 psi for a short while and then the pressure is increased to from about 450 to about 700 psi. In the hot start/full pressure procedure, the temperature is 350° F. but a pressure of from about 600 to about 800 psi (56 kg/cm$^2$) is held for the full 3 to 3.6 hours. The cured assembly is suitably cooled down at a rate of about 10° F./min. An optional postbake of the dielectric layers 22 may be used to further cure or anneal it.

The option of utilizing only the photoimageable composition to form the dielectric layer 22 has the advantage of eliminating any need for prepregs or additional material, the inclusion of which would constitute additional effort. On the other hand, if only the photoimageable composition 16 is to be used to form the dielectric layers 22, it must be applied relatively thickly in order that the portions of the photoimageable composition 16 remaining after development provide sufficient material to not only fill in the voids between the traces 14 but also to provide a sufficiently thick dielectric barrier between the traces of adjacent innerlayers 10. Because the photoimageable composition is relatively expensive, thick layers of it are expensive to produce. Also, a thick photoimageable layer produces poorer resolution than a thin one. If the initially applied photoimageable layers are to serve as the sole source of material for the dielectric layer 22, the thickness of the photoimageable layer will vary from about 2.2 mils when 1 oz. copper foil (1.4 mils thick) is used to about 3.2 mils when 2 oz. copper foil (2.8 mils thick) is used.

Another option (not illustrated) is to apply additional dielectric prepreg material to the board after etching. Again, the photoimageable composition layer is not removed from the traces, avoiding the need for stripper and treatment to avoid oxidation. The additional material could be more of the photoimageable composition 16, a compatible curable system (without the photosensitive components to minimize cost), or even conventional prepregs. In any case, the photoimageable composition layer that is left on the traces forms a portion of the dielectric layers 22 in the multilayer board.

The board 20 is then taken out of the press, the outerlayers are processed as desired and the resulting multilayer board is then processed in a conventional manner. Holes are bored through the layers, and the hole walls are plated to electrically connect the circuitry of the several layers.

The composition 16 according to the present invention includes an acrylic chemical system by which the composition is photo-polymerized and an epoxy chemical system which is curable to harden the composition after exposure and development. The two chemical systems, however, are not exclusive of each other and components of the two chemical systems are believed to interact chemically with each other. This is especially true when the composition includes a cross-linking agent (f).

The acrylic system includes the acrylate monomers (a), the epoxy-acrylate oligomer (c) and the photoinitiator (b). The epoxy system includes the epoxy resin (d) and the acidic curative (e) therefor. If a cross-linking agent (f) is used, it is selective to be reactive with free hydroxyl groups of components of both the acrylic and epoxy systems.

In one embodiment of the invention, the preferred photoimageable composition comprises (a) from about 5 to about 40% of the acrylate monomers; (b) from about 3 to about 15% photo initiator; (c) from about 5 to about 35% of an epoxy-acrylate oligomer; (d) from about 20 to about 80% of an epoxy resin; (e) from about 0.1 to about 10% of an acidic curative for the epoxy resin and; (f) from about 1 to about 15% of the cross-linking agent. The preferred composition has a photo-sensitive chemical system which renders exposed portions of the resist insoluble in alkaline aqueous developer and an epoxy-based chemical system which is curable to provide permanence and hardness to the material subsequent to exposure, development, etching and curing.

A level of the acrylate monomer (a) lower than 5% may be insufficient to insolubilize the portions of the photoresist layer that have been exposed to actinic radiation. Levels of acrylate monomer higher than 40% may result in an innerlayer which is too soft. The acrylate monomer preferably comprises from about 5 to about 35 percent of the total weight of components (a)–(f). Unless otherwise stated, all percentages of components (a)–(f) are calculated relative to the total weight of components (a)–(f). The amounts of any additional ingredients, such as fillers, solvents, etc. are also calculated relative to the sum of the weights of (a)–(f). The dried composition of (a)–(f) is soluble in alkaline aqueous solution, whereby the photoimageable composition layer 16 on a circuit laminate is developable with alkaline aqueous solution.

The acyl moiety of the acrylate monomers is represented by the formula: $[RCH=CHC=O]_x$ wherein R is hydrogen or alkyl, and x is an integer from 1 to 4. The monomers are selected from a variety of esters of acrylic and methacrylic acids, such as methyl acrylate, methyl methacrylate, hydroxyethyl acrylate, butyl methacrylate, octyl acrylate, 2-ethoxy ethyl methacrylate, t-butyl acrylate; 1,5-pentanediol diacrylate, N,N-diethylaminoethyl acrylate, ethylene glycol diacrylate; 1,4-butanediol diacrylate, diethylene glycol diacrylate, hexamethylene glycol diacrylate; 1,3-propanediol diacrylate, decamethylene glycol diacrylate, decamethylene glycol dimethacrylate; 1,4-cyclohexanedioldiacrylate; 2,2-dimethylol propane diacrylate, glyceroldiacrylate, tripropylene glycol diacrylate, glycerol triacrylate, trimethylolpropane triacrylate, pentaerythritol triacrylate; 2,2-di(p-hydroxyphenyl)-propane diacrylate, pentaerythritol tetracrylate; 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylolpropane triacrylate, ethylene glycol dimethacrylate, butylene glycol dimethacrylate; 1,3-propanediol dimethacrylate; 1,2,4-butanetriol trimethacrylate; 2,2,4-trimethyl-1,3-pentanediol dimethacrylate, pentaerythritol trimethacrylate; 1-phenyl-ethylene-1,2-dimethacrylate, pentaerythritol tetramethacrylate, trimethylol propane trimethacrylate; 1,5-pentanediol dimethacrylate; 1,4-benzenediol dimethacrylate, and the triacrylate of tris-(2-hydroxyethyl) isocyanurate. Polyfunctional acrylates and methacrylates, i.e., those having three or more acrylic or methacrylic moieties, are preferred because of the increased photospeed gained by their presence.

Epoxy-acrylate oligomer (c) means herein an oligomer formed from an epoxy backbone which is reacted with acrylic or methacrylic acid, a low molecular weight polyacrylic or polymethacrylic acid, or a mixture of them, so that at least about 90% of the epoxy groups are esterified with the acid. In the reaction of the acid with the epoxy groups of the epoxy resin, the acid molecules each form an ester bond with the resin and a hydroxyl group is formed on the vicinal carbon atom. Because substantially all of the epoxy groups are reacted with the acrylic or methacrylic acid moiety, the oligomer functions primarily as an acrylate or methacrylate, said moieties of the oligomer polymerizing along with the acrylic monomers during the photoinitiated reaction which renders exposed portions of the photoimageable composition layer insoluble to aqueous alkaline solution. The substantial hydroxyl functionality provides the basis for cross-linking with the cross-linking agent (f), if such a cross-linking agent (f) is used.

Preferred epoxy-acrylate oligomers are diacrylate (or methacrylate) esters of bisphenol A type resins, novolac resins, and mixtures thereof having a maximum epoxide content of about 0.5% by weight.

A diacrylate ester of a bisphenol A epoxy resin may be the sole epoxy/acrylate oliogomer. These oligomers are developed to combine good UV/EB cure response along with the chemical resistance and durability of the epoxy resins. Said oligomers are derived from bisphenol A resins having a functionality of two so they also have a functionality of two.

The synthesis of polyfunctional acrylate resins and other unsaturated esters from the corresponding epoxy derivatives is described in the following U.S. Pat. Nos.: 3,256,226; 3,317,465; 3,345,401; 3,373,221; 3,377,406; 3,432,478; 3,548,030; 3,564,074; 3,634,542 and 3,637,618; all of which are incorporated herein by reference.

The epoxy-acrylate oligomer preferably comprises from about 5 to about 35% of the total weight of components (a)–(f), and more preferably from about 12 to 35%. Epoxy-acrylate oligomers used in the photoimageable composition preferably have molecular weights of from about 500 to about 2000.

Also required in conjunction with the polymerizable acrylate substance is a chemical initiator system which generates free radicals in the presence of actinic radiation and thereby causes the polymerization of the acrylic substances. Polymerization of acrylic monomers and acrylic moieties of the epoxy-acrylate oligomers into a three dimensional structure insolubilizes the photoimageable composition. The choice of the photosensitive, free radical generating initiator system is not considered to be critical to the practice of the present invention, and a wide variety of such compounds may be successfully utilized in the practice of this invention. Examples of chemical photoinitiator systems include benzophenone, benzoin ether, benzil ketals, ispropylthioxanthone and acetophenone and its derivatives. Other suitable initiator systems are described, for example, in U.S. Pat. Nos. 3,469,982, 4,451,523 and 4,358,477, the teachings of which are incorporated herein by reference. The amount of photoinitiator employed may vary over a wide range, depending upon the polymerizable acrylic substances, the particular photoinitiator system and the desired time of development. Generally, the photoinitiator chemical system comprises from about 3 to about 15% of the total weight of components (a)–(f).

The material which imparts the excellent hardness and durability to the film or layer after development and final curing is the epoxy resin or mixture of epoxy resins. The epoxy resin or resins comprise from about 20 to about 80% (preferably from about 30 to about 60%) of the total weight of components (a)–(f). At high temperatures and/or in the presence of a catalyst, the epoxy groups of the resin molecules open and react with other materials present. Primarily, the epoxy resin molecules react with the acidic curative (e); however, to a certain extent, the epoxy molecules react during final curing with the cross-linking agent (f), and perhaps also with the photo-polymerized acrylic material and any remaining unpolymerized acrylate monomers or moieties. Preferably, the epoxy resin or mixture of resins is solid at about room temperature. The photoimageable composition can be applied as a liquid film to the substrate after dissolving the solid epoxy resin in the solvent-based mixture first.

A wide variety of epoxy resins is suitable for use in accordance with the present invention. Typically, epoxies of the Bisphenol A and novolac type are used. Other suitable epoxy resins are described, for example, in U.S. Pat. No. 4,092,443, the teachings of which are incorporated herein by reference. Cycloaliphatic epoxides, such as those sold under the trade names Cyanacure UVR-6100 and UVR-6110 by Union Carbide, Danbury, Conn. are also useful. Epoxy resins used in accordance with the invention preferably have epoxide equivalents of from about 90 to about 700.

The photoimageable composition according to this invention is intended to be hardened to form a permanent innerlayer. Hardening is primarily attributed to the curing of the epoxy resin. To promote sufficiently rapid curing of the epoxy resin, the photoimageable composition of the present invention employs an acidic curative. Acidic cure catalysts include not only substances which have free carboxyl groups, but also chemicals such as anhydrides, which may produce free carboxyl groups. For many applications of the invention, an anhydride, e.g., an anhydride of a multifunctional carboxylic acid is the preferred curative. Other useful catalysts are those having a blocked carboxylic group, which becomes deblocked at a threshold temperature. Epoxy cure catalysts are generally used at levels of from about 0.1 to about 10% of the total weight of components (a)–(f).

Although photoimageable compositions in accordance with the present invention do not necessarily require an additional cross-linking agent, a cross-linking agent (f) is highly desirable. A cross-linking agent is particularly useful in connecting the acrylate chemical system and the epoxy chemical system in a single interconnected network in the innerlayer. Free hydroxyl groups on the epoxy resins and the epoxy- acrylate oligomers, generally provide the basis for such cross-linking. The cross-linking agent (f) is typically used at a level of at least about 1%, e.g., from about 2 to about 15%, preferably 1.5–15%.

In accordance with one aspect of the invention, the cross-linking agent is a melamine-formaldehyde resin. During initial application of the photoimageable composition as a layer, it is believed that the melamine-formaldehyde resin reacts to some extent with the anhydride. This opens the anhydride, providing carboxyl functionality for subsequent epoxy curing. This initial reaction also has a surface drying effect. Melamine/formal-dehyde resin acts to cross-link through free hydroxyl groups. The methylol groups of melamine/formaldehyde resins may be alkoxylated to give a suitable cross-linking agent. In accordance with another aspect of the invention, a blocked, multifunctional isocyanate may be used as the cross-linking agent. The blocked isocyanate is selected to deblock generally at the cure temperature of the epoxy resin. An example of a suitable blocked isocyanate is E-caprolactam-blocked isophorone. If a blocked isocyanate is the cross-linking agent and an anhydride is the curative, some preheating of the photoimageable composition at a time prior to cure is desirable. Such preheating opens anhydride species, providing the acid functionality needed to promote curing of the epoxy resin and needed also for alkaline development.

The cross-linking agent may also be cyanoguanidine (also known as dicyandiamide or dicyanamide) or a substituted amino triazine such as 2-[β-(2'-methylimidazolyl-1']-ethyl-4,5-diamino-s-triazine, which is sold under the trademark CUREZOL 2-Mz-Azine. A mixture of the dicyandiamide and substituted triazine may also be used.

A photoresist composition having the following formulation is suitable for the purposes of this invention:

(a) from about 6.7 to about 7.1% by weight of trimethylol propane triacrylate;

(b) from about 32.4 to about 34.3% by weight of a diacrylate ester of a bisphenol A epoxy resin;

(c) a photosensitive, free radical generating initiator;

(d) from about 35.5 to about 37.6% of an epoxy cresol novolac resin; and (e) a curing agent for the epoxy resin.

The components of the photoimageable composition are selected to be soluble in a common solvent to form a single-phase liquid composition. As mentioned above, the liquid photoimageable composition may be applied to a substrate by a variety of application methods. Each application method has its own peculiarities, and photoimageable compositions in accordance with this invention may be formulated in accordance with the particular requirements of the particular method of application.

Components (a)–(f) are selected such that a dried composition of these is soluble in alkaline aqueous solution, whereby a layer of the photoimageable composition may be developed in alkaline aqueous solution, e.g., 1% sodium carbonate.

A mixture of components (a)–(f) is typically too viscous to be easily applied as a layer; accordingly, it is generally the practice to dilute the components (a)–(f) with an organic solvent. Typically, solvent is used at a level of 10–60%, but this will vary depending upon the means of application. For screen printing, solvent is generally used at 10–20%; for electrostatic spray coating, at 20–60%; for curtain coating generally at 40–50%; and for application as a dry film typically about 50%. Suitable solvents include, but are not limited to ethylene glycol monoethyl ether, ethylene glycol monopropyl ether, ethylene glycol monobutyl ether, ethylene glycol-2-ethylhexyl ether, ethylene glycol monohexyl ether, diethylene glycol monomethyl ether, diethylene glycol monoethyl ether, diethylene glycol monopropyl ether, diethylene glycol monobutyl ether, dipropylene glycol methyl ether, propylene glycol monobutyl ether, propylene glycol monopropyl ether, propylene glycol methyl ether, ethylene glycol monoethyl ether acetate, ethylene glycol monobutyl ether acetate, diethylene glycol monoethyl ether acetate, diethylene glycol monobutyl ether acetate, propylene glycol monomethyl ether acetate, ethylene glycol diacetate, 2-ethylhexyl acetate, n-butyl acetate, isobutyl acetate, n-propyl acetate, ethyl acetate, diacetone alcohol, dimethyl formamide, isophorone, diisobutyl ketone, cyclohexanone, isobutyl isobutyrate, methyl n-amyl ketone, amyl acetate, methyl amyl acetone, methyl isoamyl ketone, 2-nitropropane, methyl isobutyl ketone, methyl n-propyl ketone, isopropyl acetate, methyl ethyl ketone, tetrahydrofuran, acetone, methyl acetate, N-methyl pyrolidone and butyrolactone.

In addition to the components described above which are essential to a photoimageable composition of this embodiment the invention, the photoimageable composition may optionally contain additional components which are standard in the art. The photoimageable composition optionally may contain organic or inorganic fillers at levels up to about 4%. Some examples of fillers are micro talc, ground polyethylene, clay, fumed silica and polyvinylidene fluoride. Also, relatively small amounts of flow-control agents, dyes, antioxidants, etc. may be added. Fillers may effect the final appearance of innerlayers, e.g. provide a matte finish.

The photoimageable compositions will now be described in greater detail by way of specific examples.

EXAMPLE 1

A composition was prepared as follows:

| Component* | % Wt. |
| --- | --- |
| Tris(2-hydroxyethyl) isocyanurate triacrylate[1] | 18.7 |
| Methylolated melamine[2] | 3.4 |
| Hetron 912 (epoxy methacrylate resin)[3] | 6.2 |
| Ebecryl 3701 (diacrylate ester of a bisphenol A epoxy resin)[4] | 6.2 |
| Epoxy cresol novolac resin, epoxy eq. 235[5] | 23.8 |
| Bisphenol A epoxy resin, epoxy eq. 575–685[6] | 23.3 |
| 5-(2,5-dioxotetrahydrofuryl)-3-methyl-3-cyclohexene-1,2-dicarboxylic anhydride[7] | 8.6 |

-continued

| Component* | % Wt. |
|---|---|
| 2,2-dimethoxy-2-phenyl acetophenone[8] | 1.4 |
| 2-methyl-1-[4-(methylthio)phenyl]-2-(4-morpholinyl)-1-propanone[8] | 6.2 |
| isopropylthioxanthone[9] | 2.3 |
| | 100.0 |
| PLUS Leveling Agents, etc: | |
| Modaflow[10] | 0.9 |
| Byk 361, 306 (equal portions)[11] | 0.8 |
| Malachite green dye[12] | 0.08 |
| Filler (fumed silica)[13] | 1.5 |
| Inhibitor (MEHQ)[14] | 0.1 |
| Solvent (Amount and type appropriate to the method of application) | |
| Solvent used: Ethyl-3-ethoxy propionate (EEP)[15] | |

*Source: 1. Hitachi Corp.; 2. American Cyanamide; 3. Ashland Chemical; 4. Radcure; 5. Ciba-Geigy; 6. Dow; 7. DIC Americas; 8. Ciba-Geigy; 9. Ward Blankensop; 10. Monsanto; 11. Byk Mallinckrodt; 12. Penn; 13. Cabosil EH5; 14. Aldrich; 15. Kodak The photoimageable composition was applied as a wet film via a curtain coating process. The following coating conditions were used: 11.1 gm wet coating material per square foot laminate was applied in order to achieve an approximate dry film thickness of 2.0 to 2.2 mils on laminate and 0.8 to 0.9 mil dry film thickness on the copper circuitry. Coating speed was 80 to 90 meters per minute. The working viscosity of the photoimageable composition during coating was a Zahn Cup No. 5 reading of 22 seconds, 25° C. This was equivalent to approximately 60 wt. percent solids. The photoimageable composition was dried at 90° C. for 15 minutes, and cooled to room temperature. The second side was then coated in a manner identical to the first side. The second side was dried to a tack-free surface at 90° C. for 30 minutes. Diazo artwork was placed directly on the film, and the film was exposed to actinic radiation having a UV energy exposure level of at least 350 mjoules/cm$^2$ at the working surface. Exposure time should be such that the exposed portion of the coating remains intact during the aqueous developing process. The film was developed in a basic aqueous solution, i.e., 1% by weight sodium carbonate mono-hydrate. The film was UV-cured by exposure to actinic radiation having a UV energy exposure level of at least 2 joules/cm$^2$. The exposed copper was then etched in a cupric chloride solution (an ammoniacal etchant is an alternative) to generate the circuitry traces. The etched circuit laminates with the innerlayer resist intact are then pressed into a multi-layer board by the "kiss" procedure described above.

The performance of rigid multilayer printed circuit boards fabricated with a permanent inner layer photo resist (PILPR) according to the general procedure of Example 1 was measured by test procedures required by the IPC-ML-950-C Performance Specification and MIL-P-55110 General Specification for Printed Wiring Boards. Test coupons of these boards were made to have nominal thicknesses of 0.092, 0.125, and 0.225 inch. The IPC-A-43 comb pattern was imparted to some of the coupons and four-wire plated through hole (PTH) coupons were also tested. In general, it was determined that such boards will meet or exceed the requirements of each specification. Buried layer insulation resistance measurements and high voltage breakdown measurements are conducted on the IPC-A-43 coupons. The high voltage measurements provide a means for detecting delamination of the innerlayers. The PTH test coupon allows measurement of the PTH barrel and interface resistance so that crack initiation and propagation can be detected.

In particular, the boards of this invention meet the standards of the thermal shock test of MIL-P-55110, para. 4.8.6.3, type GP and the thermal stress (solder float) test of IPC-ML-950-C, Class 3, para.4.6.5.1. Said boards exceed the Ionic Contamination requirements of Northern Telecom Corporate Standard 5040.02, Table 5.01 when tested by the method described in Diceon Std. Doc. #108384-026 (Diceon Electronics, Inc.) which is equivalent to methods 2.3.38 and 2.3.39 of IPC-TM-650. A maximum extraction of 6.4 μg/in$^2$ is allowed by those standards and the average value for six boards of this invention was 2.7 μg/in$^2$.

EXAMPLE 2

A composition was prepared as follows:

| Component | % Wt. |
|---|---|
| Tris(2-hydroxyethyl) isocyanurate triacrylate | 18.5 |
| Methylolated melamine | 3.4 |
| Hetron 912 | 6.1 |
| Novacure 3701 | 6.1 |
| Epoxy cresol novolac resin, epoxy eq. 235 | 46.7 |
| 5-(2,5-dioxotetrahydrofuryl)-3-methyl-3-cyclohexene-1,2-dicarboxylic anhydride | 8.5 |
| 2,2-dimethoxy-2-phenyl acetophenone | 3.7 |
| 2-methyl-1-[4-(methylthio)phenyl]-2-(4-morpholinyl)-1-propanone | 4.7 |
| isopropylthioxanthone | 2.2 |
| | 99.9 |
| PLUS Leveling Agents, etc: | |
| Byk 361, 306 (equal portions) | 0.8 |
| Pigment (Penn Chips) | 1.0 |
| Filler (precipitated silica, Syloid 72) | 1.5 |
| Inhibitor (MEHQ) | 0.1 |
| Solvent (Amount and type appropriate to the method of application) | |
| Solvent used: Ethyl-3-ethoxy propionate | |

EXAMPLE 3

Each of the compositions of Examples 1 and 2 were applied as a wet film via an electrostatic spray process as follows:

The photoimageable composition was diluted to a Zahn cup No. 2 viscosity of 60 seconds using an appropriate solvent. Both sides of the base laminates were coated as they were conveyed at 5 feet per minute through an aerosol spray of the solution charged via the application of 70,000 volts. Drying of the laminates took place at 80° C. for 30 minutes. Diazo artwork was placed directly on the tack-free film and the film was exposed to actinic radiation having a UV energy exposure level of about 150 to about 400 mills joules/cm$^2$ at the working surface. Exposure time was such that the exposed portion of the coating remained intact during the development of the film in a basic aqueous solution of 1% by weight of sodium carbonate monohydrate. The film was UV-cured by exposure to actinic radiation having a UV energy exposure level of from about 1 to about 4 joules per cm$^2$. The exposed copper was then etched in a cupric chloride solution to generate the circuitry traces. The etched circuit laminates with the innerlayer resist intact are then pressed into a multi-layer board by the "kiss" procedure described above

EXAMPLE 4

Each of the compositions of Examples 1 and 2 were applied as a wet film to base sheets so as to form dry films as follows. A wet film of 6 mil thickness was applied by draw down to a base sheet. The solvent evaporated from the film which was then covered with a polyester sheet. The film was applied to a circuit board laminate by hot roll lamination. The diazo artwork was placed on the cover sheet and the film was exposed to actinic radiation having a UV energy exposure level of at least 350 mjoules/cm$^2$ at the working surface. Exposure time was such that the exposed portion of the coating remained intact during the aqueous developing process. The cover sheet was removed from the film before developing. The film was developed in a basic aqueous solution, i.e., 1% by weight sodium carbonate monohydrate. The film was UV-cured by exposure to actinic radiation having a UV energy exposure level of 2 joules/cm$^2$. The exposed copper was then etched in a cupric chloride solution to generate the circuitry traces. The etched circuit laminates with the innerlayer resist intact are then pressed into a multi-layer board by the "kiss" procedure described above.

EXAMPLE 5

A composition was prepared as follows:

| Component | % Wt. |
|---|---|
| Tris(2-hydroxyethyl) isocyanurate triacrylate | 7.8 |
| Pentaerythritol Tetraacrylate (Sartomer) | 5.7 |
| Epoxy cresol novolac resin, epoxy eq. 235 | 37.6 |
| Radcure 3701 | 19.9 |
| E-Caprolactam-blocked isophorone (Diisocyanate based adduct) | 9.7 |
| 5-(2,5-dioxotetrahydrofuryl)-3-methyl-3-cyclohexene-1,2-dicarboxylic anhydride | 10.3 |
| 2,2-dimethoxy-2-phenyl acetophenone | 5.0 |
| 2-methyl-1-[4-(methylthio)phenol]-2-(4-morpholinyl)-1-propanone | 2.8 |
| isopropylthioxanthone | 1.1 |
|  | 99.9 |
| PLUS Leveling Agents, etc: | |
| Bubble Breaker (Witco) | 1.9 |
| Byk 077 | 2.0 |
| Byk 306 | 1.1 |
| Pigment (Penn Green) | 1.2 |
| Filler (fumed silica, Cabosil EH5) | 3.5 |
| Inhibitor (MEHQ) | 0.05 |
| Solvent (Amount and type appropriate to the method of application) | |
| Solvent used: Ethyl-3-ethoxy propionate, carbitol acetate (1:1). | |

This photoimageable composition was applied as a wet film via screen printing on a printed circuit board. The screen mesh was varied from 61 to 120 mesh. The screened photoimageable composition was dried at 80° C. for 30 minutes, providing a non-tacky film. A diazo artwork was placed directly on the film, and the film was exposed to actinic radiation having a UV energy exposure level of 350 mjoules/cm$^2$. The film was developed in a basic aqueous solution, i.e., 1% by weight sodium carbonate monohydrate. The film was UV-cured by exposure to actinic radiation having a UV exposure level of 2 joules/cm$^2$.

The exposed copper was then etched in a cupric chloride solution to generate the circuitry traces. The etched circuit laminates with the innerlayer resist intact are then pressed into a multi-layer board by the "kiss" procedure described above.

EXAMPLES 6–8

The photoimageable composition described in Example 5 may also be used in the making of a multi-layered printed circuit board according to the general procedures described in Examples 1 and 3–5.

EXAMPLE 9

A composition of this invention was prepared in two parts, the components of which are a follows:

| Component | % Wt. |
|---|---|
| PART A | |
| Novacure 3701 (diacrylate ester of a bisphenol A epoxy resin) | 48.01 |
| 5-(2,5-dioxotetrahydrofuryl)-3-methyl-3-cyclohexene-1,2-dicarboxylic anhydride | 9.45 |
| QITX isopropylthioxanthone | 2.59 |
| Irgacure 907 | 7.35 |
| Cyanoguanidine (CG 1400) | 2.69 |
| BYK 306 | 1.34 |
| BYK 361 | 0.60 |
| Malachite green | 0.30 |
| Ethyl-3-ethoxy propionate | 27.65 |
|  | 100.00 |
| PART B | |
| Epoxy cresol novolac resin, ECN-1299 | 52.56 |
| Trimethylolpropane triacrylate | 10.03 |
| 2-MZ-Azine (CUREZOL) | 0.40 |
| BYK-306 | 1.54 |
| Cab-O-Sil M5A silica | 6.96 |
| Modaflow | 0.20 |
| Ethyl-3-ethoxy propionate | 28.32 |
|  | 100.00 |

For the preparation of Part A, the first two components were mixed with the Malachite green in a portion of the propionate solvent for four hours and controlling the temperature by regulating the speed of the mixer and the flow of cooling water to the reactor jacket. The remainder of the solvent and the remaining components were added while the mixture was stirred at high shear. After a two hour mixing period, the product was filtered through a 10 μ bag filter and the filtrate was a dark green viscous paste having a solids content of 76.4% (w/w), a Hegman grind of 7.5, and a Brookfield viscosity of 14,000 cps using a No. 7 spindle at 10 rpm for 2 minutes at 25° C.

For the preparation of Part B, a portion of the solvent and the epoxy novolac resin were mixed at high shear for two hours. The flow agents, the triacrylate and the Curezol were added and high shear mixing for 90 minutes followed while controlling the temperature in the same manner. The silica was then added over a one hour period, the remainder of the solvent was added, and the mixture was stirred for another four hours. This part was an opaque tan colored liquid having thixotropic properties. The viscosity was 3600 cps by the same method as for Part A. The solids content was 69.8% (w/w), and the Hegman grind was 4.5. Equal parts by weight of Part A and Part B were mixed to obtain a photoresist of this invention containing about 5% of the acrylate monomer, about 24% of the epoxy/acrylate oligomer, about 26% of the epoxy novolac resin, and about 28% solvent, by weight. On a solids basis, therefore, the amount of acrylate monomer is about 6.9%, the oligomer is about 33.3%, and the epoxy novolac resin is about 36.1% of the total weight. Laminates were coated with the photoresist using a Burkle double sided roller coater having a zero speed differential between the application rollers and the oven conveyor belt, which was traveling at about 7 feet/minute. The wet films were dried in two consecutive temperature zones, the first zone being at 105° C. and the second at 177° C. The dry films manifested little or no tack. The average thickness of the four films was 0.6±0.1 mil. Diazo artwork was placed directly on the surface of the films and each was exposed to actinic radiation having a predominant wavelength of 365 nm and an exposure energy level averaging 200±25 mj/cm$^2$ The step density in each case was 5 or greater. There was no transfer of the coating from the laminates to the artwork. The 50% breakpoint averaged 30±10 seconds so the developing time in a 1±0.05% aqueous solution of sodium carbonate monohydrate at 85° F. was about 60±20 seconds.

After drying, the exposed metal is dissolved by drawing the boards through a 3 Normal aqueous solution of cupric chloride, hydrochloric acid, and chlorine at 120° F. at a rate of about 30 inches per minute and they are then rinsed and dried. The etched circuit-bearing laminates are then stacked and pressed into a multi-layer board by the "kiss" procedure. Holes are then bored through the multiple layers so that the circuitries of each layer may be connected later by plating the hole walls. The "drill smear" on the inner copper layers must first be cleaned off, however, in a desmearing step by immersing the board in a mixture of butyl cellosolve and monoethanolamine at 130° F. for 5 minutes, rinsing it with water and then immersing it for five minutes in a mixture of two solutions at 160° F., one solution being 1 molar in sodium hydroxide and the other 1 molar in sodium permanganate. The board is rinsed with water again before being neutralized by immersion in a mixture of citric acid and sulfuric acid solutions and then dried.

The holes are then plated through first by an electroless plating procedure wherein it is immersed in an aqueous solution of sodium persulfate for a short time at room temperature, then rinsed and treated with an aqueous solution of sodium chloride and hydrochloric acid before being immersed in a catalyst bath of palladium chloride in water at 100° F. for 3–5 minutes. The board is rinsed again and treated with an aqueous solution of stannous fluoborate to fix the palladium catalyst to the non-conductive surfaces of the board. Again, the board is rinsed and then immersed in an aqueous solution of copper sulfate, a metal chelator such as sodium tartrate, and EDTA at 100° F. for 20 minutes. The board is then rinsed and treated with a solution of acetic acid and benzotriazole to inhibit oxidation and dried. In the second plating step the copper plated walls of the holes are given a thicker layer of copper in an electroplating process wherein the thin copper lining of the holes acts as the cathode as the copper ions in a bath of dilute sulfuric acid and copper sulfate are reduced and are replenished by a copper anode.

While the invention has been described in terms of certain preferred embodiments, modifications obvious to one with ordinary skill in the art may be made without departing from the scope of the present invention.

What is claimed is:

1. A photoresist composition consisting essentially of
   (a) from about 6.7 to about 7.1% by weight of trimethylolpropane triacrylate;
   (b) from about 32.4 to about 34.3% by weight of an epoxy/acrylate oligomer consisting of a diacrylate ester of a bisphenol A epoxy resin;
   (c) a photosensitive, free radical generating initiator;
   (d) from about 35.5 to about 37.6% of an epoxy cresol novolac resin;
   (e) a curing agent for the epoxy resin;
   (f) from 0% to about 15% by weight of a cross-linking agent reactive with hydroxyl groups, all based on the total weight of components (a) through (f); and
   (g) up to about 4% by weight of a filler.

2. The composition of claim 1 wherein the cross-linking agent is a mixture of cyanoguanidine and a substituted amino triazine.

3. The composition of claim 2 wherein the substituted amino triazine is 2-[β-{2'-methylimidazolyl-1'}]-ethyl-4,5-diamino-s-triazine [is mixed with the cyanoguanidine].

4. The composition of claim 1 wherein the initiator is from about 3 to about 15% and the cross-linking agent is from about 1 to about 5% by weight of the photoresist.

* * * * *